United States Patent [19]
Hecht et al.

[11] Patent Number: 5,339,952
[45] Date of Patent: Aug. 23, 1994

[54] TRANSFER CONTAINER FOR TRANSFERRING FLIMSY CIRCUIT PANELS UNDER CLEAN ROOM CONDITIONS

[75] Inventors: Lewis C. Hecht, Vestal, N.Y.; Merritt P. Sulger, deceased, late of Brackney, Pa., by Ellen Sulger, executrix; Ernst E. Thiele, Endicott, N.Y.; Mark V. Pierson; Lawrence E. Williams, both of Binghamton, N.Y.

[73] Assignee: International Business Machines Corporation, Armonk, N.Y.

[21] Appl. No.: 901,479

[22] Filed: Jun. 19, 1992

[51] Int. Cl.⁵ .................. B65D 73/02; B65D 85/42
[52] U.S. Cl. .................... 206/334; 206/328; 220/230
[58] Field of Search ............ 220/DIG. 3, 230; 206/334, 328

[56] References Cited

U.S. PATENT DOCUMENTS

| | | | |
|---|---|---|---|
| 2,351,097 | 6/1944 | Boeringer | 206/334 |
| 4,110,552 | 8/1978 | Lombardi | 220/230 |
| 4,343,584 | 8/1982 | Hudgins | 414/222 |
| 4,532,970 | 8/1985 | Tullis et al. | 141/98 |
| 4,534,389 | 8/1985 | Tullis | 141/98 |
| 4,616,683 | 10/1986 | Tullis et al. | 141/98 |
| 4,636,128 | 1/1987 | Millis et al. | 414/217 |
| 4,674,936 | 6/1987 | Bonora | 414/217 |
| 4,674,939 | 6/1987 | Maney et al. | 414/292 |
| 4,676,709 | 6/1987 | Bonora et al. | 414/207 |
| 4,705,444 | 11/1987 | Tullis et al. | 414/226 |
| 4,724,874 | 2/1988 | Parikh et al. | 141/98 |
| 4,739,882 | 4/1988 | Parikh et al. | 206/454 |
| 4,781,511 | 11/1988 | Harada et al. | 414/217 |
| 4,802,809 | 2/1989 | Bonor et al. | 414/217 |
| 4,815,912 | 3/1989 | Maney et al. | 414/217 |
| 4,851,018 | 7/1989 | Lazzari et al. | 55/356 |
| 4,859,137 | 8/1989 | Bonora et al. | 414/648 |
| 4,875,825 | 10/1989 | Tullis et al. | 414/786 |
| 4,886,163 | 12/1989 | Hubbell et al. | 206/334 |
| 4,901,011 | 2/1990 | Koike et al. | 324/158 |
| 4,923,353 | 5/1990 | Tullis et al. | 414/226 |
| 4,963,069 | 10/1990 | Wurst et al. | 414/416 |
| 4,995,430 | 2/1991 | Bonora et al. | 141/98 |

FOREIGN PATENT DOCUMENTS

| | | | |
|---|---|---|---|
| 404520 | 12/1990 | European Pat. Off. | 206/334 |
| 167055 | 6/1989 | Japan | 220/230 |

*Primary Examiner*—William I. Price
*Attorney, Agent, or Firm*—Richard M. Goldman

[57] ABSTRACT

Disclosed is a transfer container for carrying circuit panels in and between substantially contaminant free environments. The walls of the transfer container are fabricated out of substantially particulate free, unfilled polymers, such as polycarbonate. One of the end walls is an access wall. The access wall has an opening surrounded by a ferromagnetic gasket. This gasketed opening is adapted to receive a ferromagnetic door panel. The side walls, and the top and bottom walls may extend beyond the access wall, with the ends of said walls defining a plane, so that the access wall is recessed with respect to the plane defined by the said extensions. Each of the side walls have co-planar bracket pairs for holding circuit panels. Either one of, or preferably both brackets of a bracket pair have pyramidal or conical positioning pins. These pins extend upwardly from the brackets and are adapted to receive and hold a workpiece in place.

5 Claims, 1 Drawing Sheet

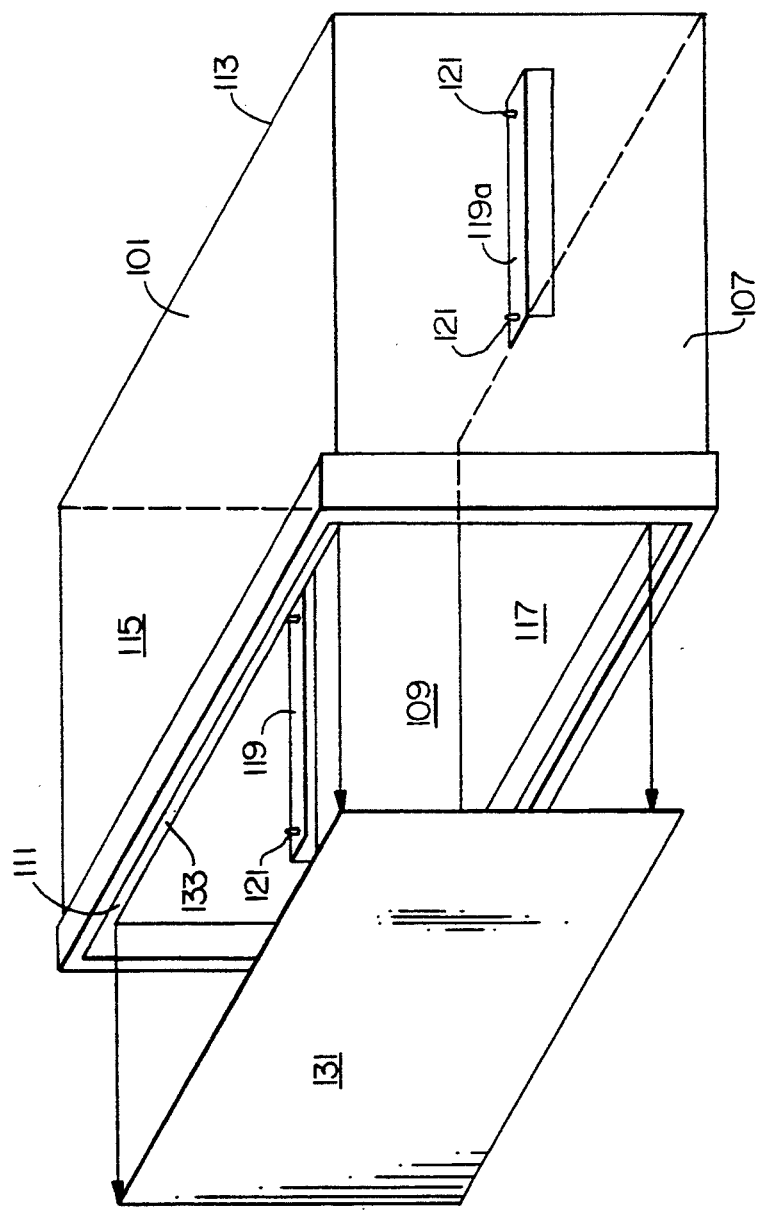

TRANSFER CONTAINER FOR TRANSFERRING FLIMSY CIRCUIT PANELS UNDER CLEAN ROOM CONDITIONS

FIELD OF THE INVENTION

The invention relates generally to the manufacture of circuit panels, as circuit cards and circuit boards, including individual layers thereof, and more particularly to the manufacture of layers, cards, boards, and panels under clean room conditions, but without a clean room. The manufacturing processes are carried out in process enclosures that are isolated islands of clean room atmosphere, connected by interprocess transfer containers.

The invention described herein is a container for carrying circuit panels in a substantially contaminant free environment, and between substantially contaminant free environments. The container is a walled container having a pair of parallel side walls, a pair of parallel end walls, a top, and a bottom. The container is fabricated of a substantially particulate free, unfilled, polycarbonate to avoid introduction of filler materials into the clean room environment of the process enclosures or the transfer container.

One of the end walls is an access wall having an opening surrounded by a ferromagnetic gasket. The end wall and gasket are intended to receive a ferromagnetic door panel. Each of the side walls has co-planar bracket pairs for holding circuit panels.

BACKGROUND OF THE INVENTION

As dimensions shrink and circuit densities increase in circuit board and card manufacturing, the problems heretofore associated with and limited to IC manufacture are now increasing relevant to circuit board and card manufacture. For example, Class-100K and 10K cleanrooms are typically used in card and board manufacturing. Circuit cards and boards are 10" by 15", and even 24" by 28", and larger, with thickness of 1-5 mils, 2 mil feature sizes, and circuit densities that result in ten or more linear feet of Cu wiring per square inch of card or board surface.

In this 2 mil and smaller geometry environment, a dust particle that would have gone unnoticed in a 4 mil geometry environment can result in incomplete etching during subtractive circuitization resulting in an electrical open.

A small volume of still, particle free air, with no internal (local) source of particles is the cleanest possible environment for high circuit density circuit card and board manufacturing.

The Standard Mechanical Interface (SMIF) For Wafer Processing of Integrated Circuits A small volume of still, particle free is air, with no internal (local) source of particles is attained in the silicon semiconductor wafer industry by the SMIF (Standard Mechanical Interface) system. SMIF provides a movable sealable container and a series of small work volumes. The SMIF system includes means for loading and unloading the container, means for placing the wafers (and wafer cassettes) into and removing the wafers (and wafer cassettes) from an individual work volume, and a canopy to seal the movable sealable container and the work volume during transfer. Finally, the SMIF system includes work volume air processing means.

SMIF reduces the need for (1) costly, large volume air handling, and (2) temperature and humidity control.

The SMIF Container

U.S. Pat. No. 4,963,069 to Thomas Kahlden, Rudolf Simon, and Manfred Wurst for CONTAINER FOR THE HANDLING OF SEMICONDUCTOR DEVICES AND PROCESS FOR PARTICLE-FREE TRANSFER describes a container and transfer process intended to prevent contamination of wafer scale semiconductor devices from occurring, even when the wafer container is stored or handled under unclean room conditions. The wafers inside the container are subjected to an approximately laminar clean air stream passing around them in a clean air zone. A higher static pressure is maintained in the clean air zone than in the surrounding space. The surrounding space is subject to pollution with an inadmissibly high number of particles. The clean air stream carries along any dirt particles there may still be, so that these dirt particles cannot settle on the semiconductor devices. As a result of the higher static pressure, a forced flow from the clean air zone of the higher static pressure outwards into the surrounding space is achieved. This prevents entry of dirt particles from the surrounding space.

U.S. Pat. No. 4,815,912 to George W. Faraco, George A. Maney, and Mihir Parikh for BOX DOOR ACTUATED CONTAINER describes a transportable container for wafers in-process. The container is designed for use with passage elevator means for passing the wafer cassettes between work station locations. The container includes the body member, an opening in the body member, an airlock door across the opening, and a wafer cassette. The wafer cassette is supported by the door and sized for passage through the door. Passage of the wafer cassette downward through open door is effected by an elevator.

U.S. Pat. No. 4,739,882 to Anthony C. Bonora, George Faraco, Barney H. Huang, and Mihir Parikh for CONTAINER HAVING DISPOSABLE LINERS describes a transportable container for storing articles, such as wafers, while maintaining the articles clean. The container utilizes a liner that is insertable into the interior space and surrounds the contents. The wafer cassette wafers are supported by the container door.

U.S. Pat. No. 4,724,874 to Anthony C. Bonora and Mihir Parikh for SEALABLE TRANSPORTABLE CONTAINER HAVING A PARTICLE FILTERING SYSTEM describes a sealable transportable container for use with semiconductor wafer processing equipment. The container is a double container, with an inner container and an outer container. The outer container has a port plate with a port door sealably mating to the port plate. Inside of the outer transportable container is an inner container, referred to as a box. This box has an interior space for containing the wafer cassettes. The box has a conduit for communicating between its interior space and the environment external to the box, i.e., the surrounding fabrication facility. The conduit has a filter for filtering fluids, i.e., air, passing through the conduit. The box is a sealed box with a box top having sealing surfaces and a box door sealably mating with the box top.

The port plate also includes sealing surfaces and is sealably mated to the box top. The port door has a sealing surface and is sealably mated to the port plate. The inner or box door includes a latch for mechanically opening and closing of the box. The outer or port door includes a device for activating the latch on the inner or box door.

The SMIF Docking Interface

U.S. Pat. No. 4,995,430 to Anthony C. Bonora and Frederick C. Rosenquist for SEALABLE TRANSPORTABLE CONTAINER HAVING IMPROVED LATCH MECHANISM describes a transportable, sealable container, such as a SMIF (Standard Mechanical Interface) pod, with an outer box and box door. The box has a first sealing surface and the box door has a second sealing surface. These sealing surfaces form a seal when the box door is moved in a sealing direction with respect to the box.

A latch mechanism is provided in the box door. This latch mechanism is operable in two stages. The first stage of operation moves the latch members from a retracted position to an extended position. In the retracted position the latch members are in the box door so as to allow movement of the box door with respect to the box.

In the extended position the latch members are adjacent to latch surfaces of the box. Movement from the retracted to the extended position is performed without contact between the latch members and the latch surfaces. This avoids any scraping or rubbing action which would create particles in the "clean" interior region of the box.

The second stage of operation engages latch members with the latch surfaces to move the box door in the sealing direction; this second stage of the operation is also performed without scraping or rubbing of the latch members and the latch surfaces.

U.S. Pat. No. 4,674,939 for George Faraco, George A. Maney, and Andrew W. O'Sullivan for SEALED STANDARD INTERFACE APPARATUS describes a partitioned container apparatus for keeping workpieces, such as semiconductor wafers, clean during a fabrication sequence. The container is used to transport the wafers to and between ports in the canopies of the processing equipment.

The container has first and second regions for making first and second seals. A container door seals the workpieces into the box. The container has a second region for making the second seal and has a third region for making a third seal.

The processing equipment canopy ports are adapted for receiving the container and container door and for transferring the container door and the container contents into a region of the processing equipment beneath the canopy. The canopy has a first region for making the first seal with the container. Also, the canopy has a fourth region surrounding the port for making a fourth seal.

A port door is provided for closing the canopy port when no container is present. The port door has a second region for making the second seal with the container and has a fourth region for making the fourth seal with the canopy.

A container door latch is provided for latching the container door to the container so that the second seal is made and released in the second region between the container door and the container by operation of the container door latch.

A container latch is provided for latching the container to the canopy so that the first seal is made or released in the first region between the container and the canopy by the operation of the container latch.

U.S. Pat. No. 4,616,683 to Mark E. Johnston, Mihir Parikh, David L. Thrasher, and Barclay J. Tullis for PARTICLE-FREE DOCKABLE INTERFACE FOR INTEGRATED CIRCUIT PROCESSING (A continuation of U.S. Pat. No. 4,532,970) describes a particle-free dockable interface for linking together two spaces. Each of these spaces encloses its own separate clean air environment.

The interface has interlocking doors on each space which fit together to trap particles, that is, particles which have accumulated from the dirty ambient environment on the outer surfaces of the doors.

U.S. Pat. No. 4,534,389 to Barclay J. Tullis for INTERLOCKING DOOR LATCH FOR DOCKABLE INTERFACE FOR INTEGRATED CIRCUIT describes a particle-free dockable interface with an interlocking latch for linking together two spaces each enclosing a clean air environment. The dockable interface prevents the opening of the interface doors without the presences of two mating system components.

The interface has interlocking doors on each space which fit together to trap particles which have accumulated from the dirty ambient environment on the outer surfaces of the doors.

The interlocking latch has a latch spring and latch foot assembly coupled to a first one of the two clean air spaces and a mating door pull and port latch assembly coupled to the second of the two clean air spaces. the latch foot, door pull, and port latch assemblies are constructed so that the interlock doors cannot be opened unless the first and second clean air spaces are properly aligned and mated.

U.S. Pat. No. 4,532,970 to Mark E. Johnston, Mihir Parikh, David J. Thrasher, and Barclay J. Tullis for PARTICLE-FREE DOCKABLE INTERFACE FOR INTEGRATED CIRCUIT PROCESSING describes a particle-free dockable interface for linking together two spaces each enclosing a clean air environment. The interface is composed of interlocking doors on each space which fit together to trap particles which have accumulated from the dirty ambient environment on the outer surfaces of the doors.

Shortcomings of the SMIF System

The SMIF solution, while adequate for wafer processing, including batch processing of cassettes of large semiconductor wafers, e.g., wafers of up to about 5 inches in diameter, is not directly applicable to panel fabrication. This is because panels are far larger, the smallest panels having at least ten times the surface area of the largest wafers. Moreover, the individual layers making up the finished thin panels are flexible films, e.g., flexible and flimsy polymeric films, including copper foiling bearing polymeric films, less than 0.01 inch thick. For these reasons, wafer processing techniques are not directly applicable to panel fabrication.

OBJECTS OF THE INVENTION

It is a primary object of the invention to provide clean room environments for panel processing and fabrication.

It is a further object of the invention to isolate the panels in-process from human generated sources of contamination.

It is a further object of the invention to provide a clean room environment of Class-100 air for panel processing and fabrication for panel processing and fabrication in close proximity to the actual panel processing and fabrication.

SUMMARY OF THE INVENTION

These and other objects of the invention are accomplished by the method and apparatus of our invention. Specifically, the invention described herein utilizes isolated islands of clean room grade air to provide assured cleanliness. This is accomplished even in the event of external transients and disturbances.

The apparatus of the invention provides a clean room environment without a clean room. The clean room environment is provided in close proximity to the in-process circuit cards and boards. More particularly, the clean room environment is provided in islands or enclosures of clean room grade, substantially contaminant free, air. By this expedient it is possible to avoid the expense and difficulty of providing a large cubic foot clean room, with clean room conditions tens of feet away from the nearest card or board. Significantly relaxed, operator friendly, clean room standards are maintained in the rest of the process area.

The method and apparatus of the invention isolates panels, cards and boards in-process from human generated contamination, such as hair, skin, and breath, and isolates the work space and its environment through dedicated work space enclosures that direct clean air, e.g., Class-100 air, into the process equipment enclosures through carefully engineered and focused Class-100 air handling equipment.

According to the invention, Class-100 standards are attained and maintained in proximity to the in-process cards, boards, and panels, rather then just at the ceiling of the clean room. This is accomplished by partitioning large volume panel, board, and card fabrication facilities into smaller volumes. These smaller volumes permit precise monitoring and control of the card and board fabrication environment. Moreover, separating the "human side" of the facility from the "clean side" of the process minimizes human borne sources of contamination.

Partitioning the contaminant sensitive work pieces and process steps from the rest of the plant is accomplished through an integrated system of process equipment containing process enclosures of controlled atmosphere, dustproof transporter boxes, and airlock and material handling interfaces between the process equipment process enclosures and the transporter boxes.

Inter-Process Transporters

Panels, including batches of in-process panels, are transported between process equipment enclosures by inter-process transporters. These inter-process transporters are analogous to the SMIF Pod ®, a sealed wafer carrier that completely isolates the wafers from the environment between "clean" enclosures. However, the SMIF Pod ® is used transport cassettes of small, rigid wafers, while the inter-process transporter disclosed herein transports, large, thin, flimsy, flexible panels. This function gives rise to significantly different mechanical problems.

The transporter container carries the circuit panels between substantially contaminant free environments in a substantially contaminant free environment. The container is a walled container having a pair of parallel side walls, a pair of parallel end walls, a top, and a bottom. The container is fabricated of a substantially particulate free, unfilled, polycarbonate to avoid introduction of filler materials into the clean room environment of the process enclosures or the transfer container.

One of the end walls is an access wall having an opening surrounded by a ferromagnetic gasket. The end wall and gasket are intended to receive a ferromagnetic door panel. Each of the side walls has co-planar bracket pairs for holding circuit panels.

These dustproof inter-process transfer boxes interface with the small volume process equipment process enclosures through airlocks. The airlocks interfacing between the process equipment and the transporter boxes, have linear dimensions that are also several orders of magnitude greater then those encountered in SMIF wafer handling equipment.

THE FIGURE

The invention can be understood by reference to the FIGURE.

The FIGURE is a cut-away view of a transfer container showing shelves and brackets for carrying in-process panels.

DETAILED DESCRIPTION OF THE INVENTION

The integrated process and system for handling in-process panels, cards, and boards includes:

- Localized, sealed clean-room enclosures for process equipment. These sealed enclosures contain process equipment stations in a highly localized and contained, clean room environment.
- Minimum volume, dustproof containers for transferring, storing, and handling cards and boards. These transfer containers are several magnitudes greater volume then SMIF boxes for wafers. These transfer containers have clean room capability, and are fabricated of materials of construction that are relatively free of sources of contamination. Exemplary materials are unfilled, transparent polycarbonates. This is because fillers are a source of particulates. Preferably the transfer containers are transparent. This makes it easier for the operator to align the doors at the dockable interface with the equipment enclosure, and also to handle in-process panels inside and during docking.
- Mating airlocks at the interface between the process equipment enclosures and at the transfer containers, where linear dimensions of the airlocks are several orders of magnitude greater then those required for wafer handling equipment.
- Transfer arm means for transferring the in-process panels between the transfer containers and the process enclosures.
- Jigs and tools for holding the large, non-rigid in-process panels during transfer.
- Computer monitoring and integration of the in-process panels, the process sequences and steps, and the total process.

The interface between the localized, clean room environment of the individual process enclosure 11 and the inter process transfer container 101 is provided by an airlock transfer port. The airlock transfer port utilizes a combination of (1) co-operating sealable doors in the process enclosure 11 and the transfer container 101, (2) electromagnetic and ferromagnetic clamping means for simultaneously opening the doors, and (3) peripheral gaskets surrounding the pair of doors to provide a substantially clean room environment in the airlock.

Interprocess Transfer Container

The interprocess panel transfer container 101 provides clean room transfer of panels between pairs of process enclosures, 11, for example, adjacent process enclosures 11. The interprocess panel transfer container or transporter 101 is characterized by being substantially free of sources of particulate contamination, the minimum volume necessary for storing and handling cards and boards, and suitable airlocks for mating with facing airlocks 31a, 31b, 31c, of the process enclosures 11a, 11b, and 11c.

In a particularly preferred embodiment of the invention the panel transfer container 101 is formed of unfilled polycarbonate. This is because fillers are a source of particulates. A further advantage of unfilled polycarbonates is that they are transparent. The use of transparent materials of construction for the panel transfer containers 101 makes the panel transfer containers 101 easier to align at the dockable interface 31. A further advantage of transparent materials of construction is that it is easier to to handle foils and thin panels inside the panel transfer container, especially during docking.

The transfer container 101 is a walled container having a facing pair of parallel side walls, 107 and 109, a facing pair of parallel end walls 111 and 113, a top, 115, and a bottom, 117, fabricated of a substantially particulate free material, such as unfilled, polycarbonate. One of the end walls is an access wall having an opening surrounded by a ferromagnetic gasket 133. This ferromagnetic gasket is adapted to receive a ferromagnetic door panel 131.

Each of said side walls 107 and 109 has at least one pair of co-planar bracket pairs 119. These bracket pairs 119 hold the panels 100. The panels are in the fixtures 171 described hereinabove.

At least one bracket 119a or 119b of each bracket pair has a pyramidal or conical positioning pin 121. The positioning pin 121 extends upwardly from the bracket 119 and is adapted to receive a workpiece bracket 171. A mating aperture 191 in the fixture 171 receives the positioning pin 121.

In a preferred embodiment wherein both brackets 119a and 119b of a bracket pair have the pyramidal or conical positioning pins 171 extending upwardly and adapted to receive a workpiece fixture 171.

While the invention has been described with respect to certain preferred embodiments and exemplifications, it is not intended to limit the scope of the invention thereby, but by the claims appended hereto.

We claim:

1. A transfer container for carrying circuit panels in and between substantially contaminant free environments, comprising:
   a. a walled container having a facing pair of parallel side walls, a facing pair of parallel end walls, a top, and a bottom, comprising a substantially particulate free, unfilled, polycarbonate;
   b. one of said end walls being an access wall having an opening surrounded by a ferromagnetic gasket and adapted to receive a ferromagnetic door panel; and
   c. each of said side walls having co-planar bracket pairs for holding circuit panels.

2. The transfer container of claim 1 wherein at least one bracket of a said bracket pair having a pyramidal or conical positioning pin extending upwardly therefrom and adapted to receive a workpiece.

3. The transfer container of claim 2 wherein both brackets of a said bracket pair have pyramidal or conical positioning pins extending upwardly therefrom and adapted to receive a workpiece.

4. The transfer container of claim 1 wherein the side walls, and the top and bottom walls extend beyond said access wall, the ends of said walls defining a plane, and the said access wall is recessed with respect to the plane defined by the said extensions.

5. A transfer container for carrying circuit panels in and between substantially contaminant free environments, comprising:
   a. a walled container having a facing pair of parallel side walls, a facing pair of parallel end walls, a top, and a bottom, comprising a substantially particulate free, unfilled, polycarbonate;
   b. one of said end walls being an access wall having an opening surrounded by a ferromagnetic gasket and adapted to receive a ferromagnetic door panel; the side walls, and the top and bottom walls extend beyond said access wall, the ends of said walls defining a plane, and the said access wall being recessed with respect to the plane defined by the said extensions, and
   c. each of said side walls having co-planar bracket pairs for holding circuit panels, both brackets of a said bracket pair having pyramidal or conical positioning pins extending upwardly therefrom and adapted to receive a workpiece.

* * * * *